(12) United States Patent
Lin et al.

(10) Patent No.: US 10,890,624 B2
(45) Date of Patent: Jan. 12, 2021

(54) TESTING FIXTURE, TESTING SYSTEM FOR CELL TEMPERATURE PROBE AND METHOD FOR TESTING CELL TEMPERATURE PROBE

(71) Applicant: CHROMA ATE INC., Taoyuan (TW)

(72) Inventors: Chuan-Tse Lin, Taoyuan (TW);
Ming-Tsung Liu, Taoyuan (TW);
Kuan-Chen Chen, Taoyuan (TW);
Chien-Po Lin, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 145 days.

(21) Appl. No.: 16/180,158

(22) Filed: Nov. 5, 2018

(65) Prior Publication Data
US 2019/0162795 A1  May 30, 2019

(30) Foreign Application Priority Data
Nov. 24, 2017 (TW) .............................. 106140914 A

(51) Int. Cl.
*G01R 31/36* (2020.01)
*H01M 10/48* (2006.01)
(Continued)

(52) U.S. Cl.
CPC ....... *G01R 31/3646* (2019.01); *G01R 31/387* (2019.01); *G01R 31/396* (2019.01); *H01M 10/486* (2013.01); *H01M 10/443* (2013.01)

(58) Field of Classification Search
CPC .............. G01R 31/36; G01R 31/3644; G01R 31/3646; G01R 31/385; G01R 31/387; G01R 31/388; G01R 31/396; G01R 35/00; H01M 10/44; H01M 10/441; H01M 10/443; H01M 10/48; H01M 10/486
See application file for complete search history.

(56) References Cited

U.S. PATENT DOCUMENTS 5,232,667 A * 8/1993 Hieb .................. G01N 27/28
                                                           204/408
2010/0019773 A1* 1/2010 Son .................... H01M 10/486
                                                           324/431
(Continued)

FOREIGN PATENT DOCUMENTS

JP           2016180755 A  * 10/2016

*Primary Examiner* — Huy Q Phan
*Assistant Examiner* — David B Frederiksen
(74) *Attorney, Agent, or Firm* — Locke Lord LLP; Tim Tingkang Xia, Esq.

(57) ABSTRACT

A testing fixture for a cell temperature probe includes a microcomputer, a temperature probe, a measurement case, a temperature instrument and heaters. The microcomputer configured to receive a control command for executing a testing process. The measurement case has an outer surface and an inner surface. The outer surface includes a probe-contacting area used for being contacted by the cell temperature probe within a formation device in the testing process. The temperature instrument is electrically connected to the microcomputer and has a sensing terminal disposed on the inner surface of the measurement case. The location of the sensing terminal is aligned with the probe-contacting area in a direction of a thickness of the measurement case. The heaters are electrically connected to the microcomputer and thermally to the measurement case.

10 Claims, 6 Drawing Sheets

(51) Int. Cl.
*G01R 31/387* (2019.01)
*G01R 31/396* (2019.01)
*H01M 10/44* (2006.01)

(56) References Cited

U.S. PATENT DOCUMENTS

| | | | |
|---|---|---|---|
| 2014/0175083 A1* | 6/2014 | Bhaidasna | H05B 1/0269 |
| | | | 219/386 |
| 2016/0018473 A1* | 1/2016 | Rocci | H01M 10/48 |
| | | | 324/431 |
| 2017/0067843 A1* | 3/2017 | Rouchon | G01N 33/0047 |
| 2017/0248632 A1* | 8/2017 | Thompson | G01R 31/2875 |

* cited by examiner

TESTING FIXTURE, TESTING SYSTEM FOR CELL TEMPERATURE PROBE AND METHOD FOR TESTING CELL TEMPERATURE PROBE

CROSS-REFERENCE TO RELATED APPLICATIONS

This non-provisional application claims priority under 35 U.S.C. § 119(a) on Patent Application No(s). 106140914 filed in Taiwan, R.O.C. on Nov. 24, 2017, the entire contents of which are hereby incorporated by reference.

TECHNICAL FIELD

The disclosure relates to a testing fixture, a testing system for cell temperature probes and a method for testing the cell temperature probes, more particularly to a testing fixture, a testing system and a testing method for verifications and calibrations associated with the cell temperature probes.

BACKGROUND

In general, a cell process includes both of a charging and a discharging process performed in a cell formation system. In order to ensure the safety of process, a cell process equipment uses one or more cell temperature probes to monitor cells in states of charging and discharging, so that an occurrence of safety problems caused by abnormal temperatures generated during the process of charging and discharging can be avoided. Therefore, in the cell process, it is important that whether the cell temperature probes operate normally and the overheated cells can be detected immediately so as to warn monitoring staff to deal with the matter.

A cell temperature probe may be incapable of detecting the temperature of cells accurately because of some factors such as aging/deterioration caused by the uses of long-term, or defects or poor qualities included in the cell temperature probe itself. The monitoring staff is not able to obtain correct temperature information associated with the cells immediately. Therefore, it becomes an important issue in the field that how a cell temperature probe can be tested effectively so as to determine whether the cell temperature probe operates normally or not.

SUMMARY

A testing fixture for a cell temperature probe adapted to a formation device and a central control system is disclosed according to one embodiment of the present disclosure. The formation device is configured to perform a testing process according to a control command from the central control system. The testing fixture includes a microcomputer, a measurement case, a temperature instrument and a set of heaters. The microcomputer is communicatively connected to the central system and configured to receive the control command for performing the testing process. The measurement case has an outer surface and an inner surface opposite to the outer surface. The outer surface includes a probe-contacting area adapted to be contacted by the cell temperature probe within the formation device during the testing process, so that a sensing temperature value related to the measurement case is obtained by the cell temperature probe. The temperature instrument is electrically connected to the microcomputer. The temperature instrument has a sensing terminal disposed on the inner surface of the measurement case, and a location of the sensing terminal disposed in the inner surface is aligned with the probe-contacting area in a direction of a thickness of the measurement case. The set of heaters is electrically connected to the microcomputer and thermally connected to the measurement case.

A testing system for a cell temperature probe is disclosed according to one embodiment of the present disclosure. The testing system includes a central control system, at least one formation device and a testing fixture. The central control system is configured to generate a control command. The at least one formation device is communicatively connected to the central control system. Each of the at least one formation device includes a cell temperature probe and configured to perform a testing process according to the control command. The testing fixture is communicatively connected to the central control system and configured to receive the control command and selectively perform the testing process for one of the at least one formation device. The testing fixture is capable of detachably connecting to a compartment of the formation device, and the cell temperature probe adapted to contact a probe-contacting area within the testing fixture.

A method for testing cell temperature probe is disclosed according to one embodiment of the present disclosure. The method includes the following steps: outputting a control command, by a central control system, to at least one formation device and a testing fixture, wherein each of the at least one formation device includes a plurality of cell temperature probes; performing a testing process according to the control command by the at least one formation device and the testing fixture. Wherein the testing process includes the following steps: connecting the testing fixture to a compartment of one of the at least one formation device detachably; obtaining a respective one of a plurality of sensing temperature values by each of the plurality of cell temperature probes of the formation device; obtaining a plurality of standard temperature values by the testing fixture, with each of the plurality of standard temperature values associated with a respective one of the plurality of cell temperature probes in a respective location; sending at least portion of the plurality of standard temperature values back to the formation device by the testing fixture; and testing the plurality of cell temperature probes, by the formation device, according to the at least portion of the plurality of standard temperature values sent by the testing fixture and the at least portion of the plurality of sensing temperature values.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
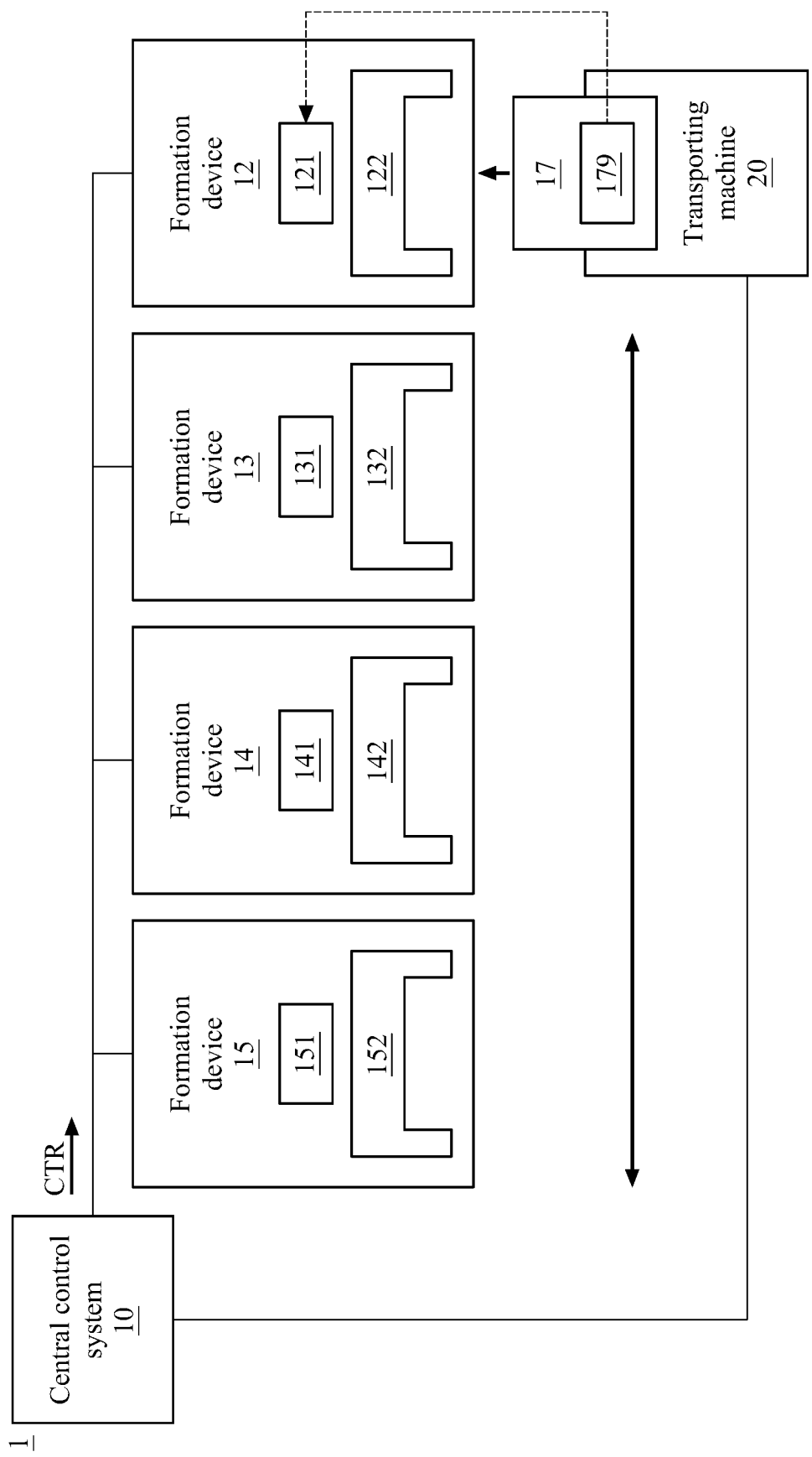
FIG. 1 is a block diagram of a testing system according to one embodiment of the present disclosure.

Please refer to FIG. 1, which is a block diagram of a testing system according to one embodiment of the present disclosure. As shown in FIG. 1, a testing system 1 includes a central control system 10, a plurality of formation devices 12-15 (each of the formation devices is a set of formation equipment practically) and a testing fixture 17. When it is desired to test a cell temperature probe within one of the formation devices 12-15, first of all, the central control system 10 outputs a control command CTR to the formation device to be tested via a local area network (LAN). As shown in FIG. 1, the formation device 12 serves as the target formation device to be tested. When the formation device 12 receives the control command CTR, an internal computer of the formation device 12 (not shown in figures) would determine whether to execute the control command CTR. When it is determined that the control command CTR is allowed to be executed, a variety of parameters from the central control system 10 is loaded so as to perform a testing process for the cell temperature probe within the formation device 12. In the embodiment, the testing fixture 17 also receives the control command CTR and performs the testing process for the cell temperature probe according to the control command CTR. In practice, as shown in FIG. 1, each of the formation devices 12-15 has a compartment 122, 132, 142 and 152. In the testing process shown in the embodiment, the testing fixture 17 is detachably connected to the compartment 122 of the formation device 12, so that the cell temperature probe in the formation device 12 can be contacted with a probe-contacting area of the testing fixture 17 to perform testing for the cell temperature probe. In this embodiment, the number of the formation devices are merely for illustration, and the present disclosure is not limited to the number of the formation devices.

Figure 2:
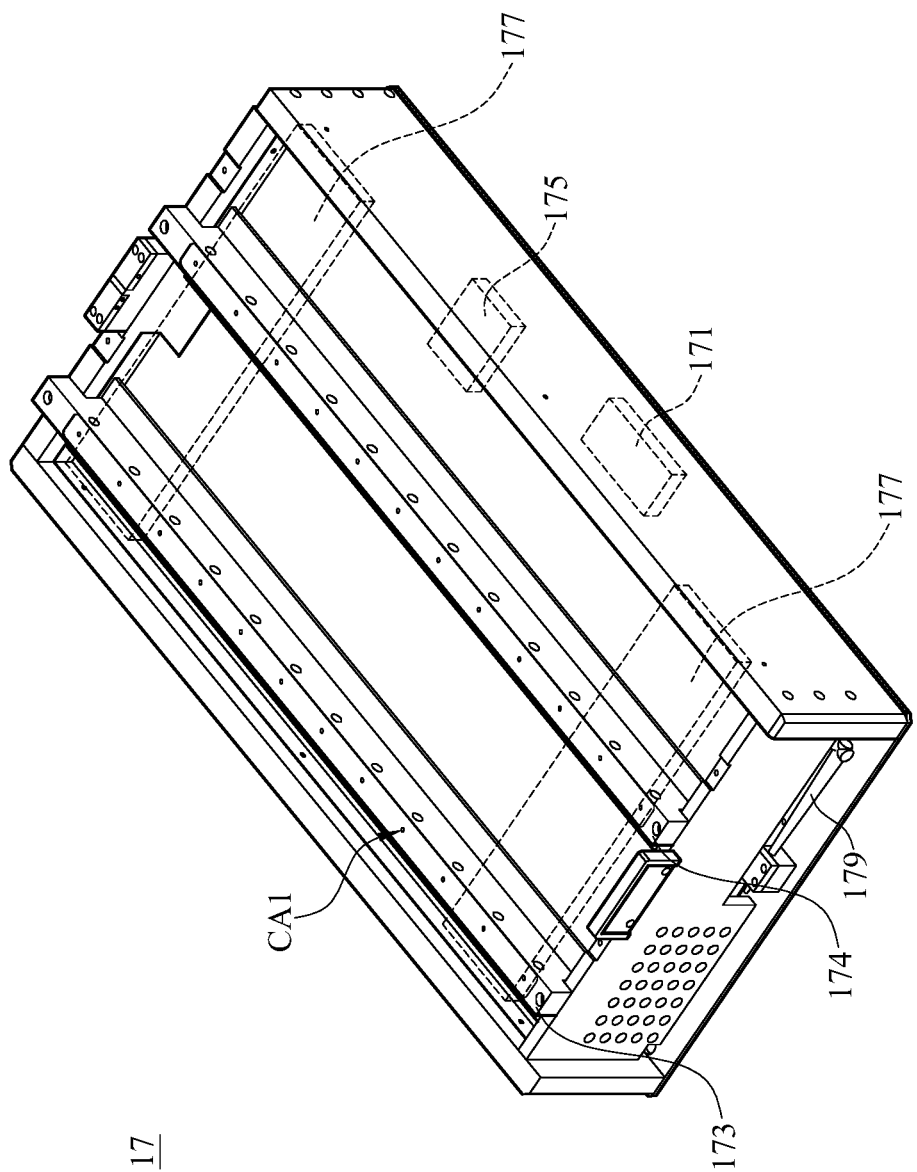
FIG. 2 is a structural diagram of a testing fixture according to one embodiment of the present disclosure.
Figure 3:
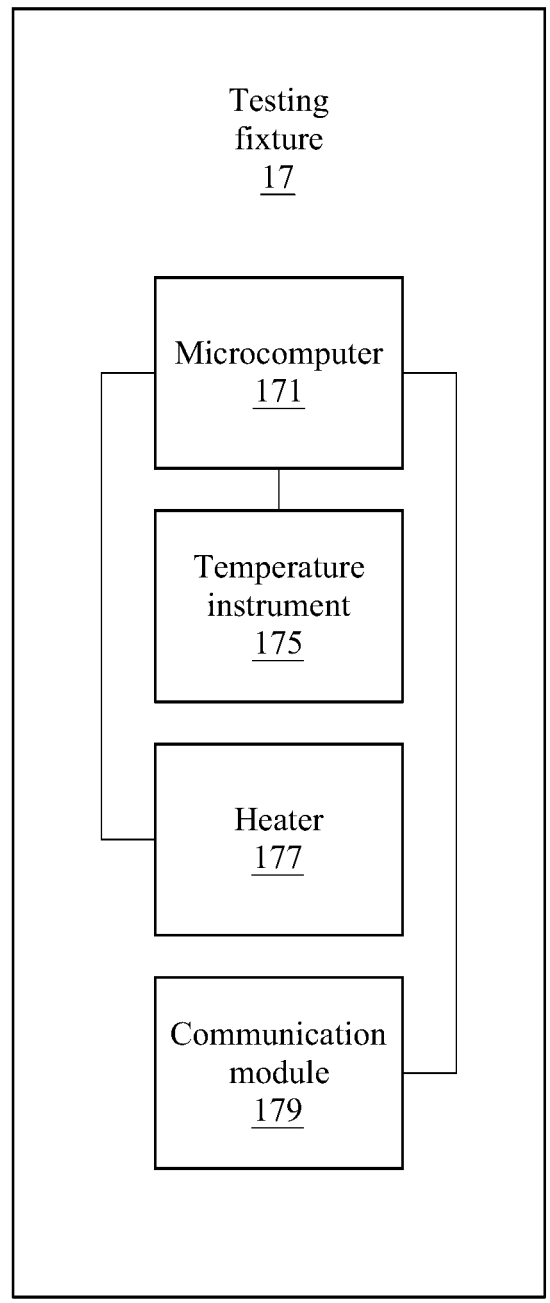
FIG. 3 is a block diagram of the testing fixture according to one embodiment of the present disclosure.

Please refer to FIG. 1, FIG. 2 and FIG. 3, which are a structural diagram of the testing fixture 17 and a block diagram of the testing fixture 17 according to one embodiment of the present disclosure. As shown in figures, the testing fixture 17 includes a microcomputer 171, two measurement cases 173 and 174, a temperature instrument 175, a set of heaters 177 and a communication module 179. The microcomputer 171 is communicatively connected to the central control system 10 and configured to receive the control command CTR. The microcomputer 171 performs the testing process according to the control command CTR. Although the testing fixture 17 includes two measurement cases 173-174 in this embodiment of FIG. 2, it is possible that the testing fixture 17 has a single measurement case or more than three measurement cases according to actual demands practically. The present disclosure is not limited to the number of the measurement cases given in the embodiment. In an implementation, as shown in FIG. 1 and FIG. 2, the formation devices 12-15 and the testing fixture 17 respectively have the communication modules 121, 131, 141, 151 and 179. Whenever the testing fixture 17 completes a testing process for one of the formation devices, the testing fixture 17 sends the obtained one or more parameters to the respective formation device via the communication module 179 and the respective one of the communication modules 121-151. For example, after completing the testing process in the formation device 12 and collecting measurement data, the testing fixture 17 sends the collected measurement data to the formation device 12 via its own communication module 179 and the communication module 121 of the formation device 12. In practice, the communication modules 121-151 and 179 are WIFI communication modules or implemented by other equivalent wireless communication techniques. The present disclosure is not limited to the types of the communication modules mentioned in the above embodiment.

Figure 4:
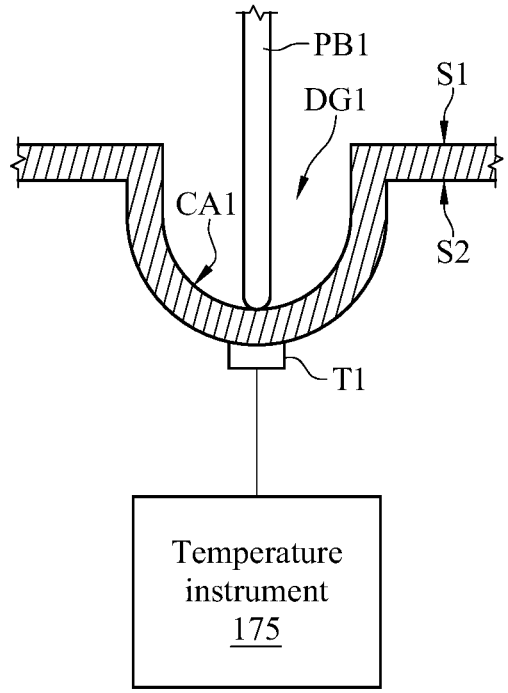
FIG. 4 is a part of sectional view of a measurement case operated with a cell temperature probe of a formation device according to one embodiment of the present disclosure.

For the convenience of illustrations for the structures of the measurement cases, the measurement case 173 is illustrated as an example. Please refer to FIG. 4, which is a part of a sectional view of the measurement case 173 operated with a cell temperature probe PB1 of the formation device 12 according to one embodiment of the present disclosure. As shown in FIG. 4, the measurement case 173 has an outer surface S1 and an inner surface S2 opposite to each other. The outer surface S1 includes a probe-contacting area CA1 which is adapted to be contacted with the cell temperature probe PB1 of the formation device 12 during the testing process. The temperature instrument 175 is electrically connected to a microcomputer 171 as shown in FIG. 3, and the temperature instrument 175 has a sensing terminal T1 disposed on the inner surface S2 of the measurement case 173. The location of the sensing terminal T1 disposed on the inner surface S2 is aligned with the probe-contacting area CA1 in the direction of the thickness of the measurement case. As shown in FIG. 2 and FIG. 3, the set of heaters 177 is electrically connected to the microcomputer 171 and thermally connected to the measurement case 173. In practice, as shown in FIG. 2, the set of heaters 177 includes two heat sources respectively disposed on two opposite sides of the measurement case 173, and performing a process of heating for the measurement case 173 according to a preset temperature set up by the microcomputer 171.

In the testing process, the microcomputer 171 controls the set of heaters 177 to perform the process of heating for the measurement case 173, so that the temperatures of the measurement case 173 on the probe-contacting area CA1 and the area near the probe-contacting area CA1 are raised to a certain temperature (e.g. 60° C.). The certain temperature is used as a simulated temperature which a cell reaches during a charging/discharging process. The cell temperature probe PB1 of the formation device 12 senses the preset temperature to output a signal indicating a sensing value when contacting the probe-contacting area CA1. Meanwhile, the sensing terminal T1 of the temperature instrument 175 senses the preset temperature to output a signal indicating standard temperature value. The microcomputer 171 sends the standard temperature value back to the internal computer of the formation device 12 via the communication module 179 and 121. In further, the formation device 12 tests the cell temperature probe PB1 according to the sensing temperature value and the standard temperature value. In practice, the microcomputer 171 receives one or more parameters from the central control system 10 so as to control the set of heaters 177 to heat the measurement case 173 such that the temperature of the measurement case 173 reaches the temperature to be tested (namely "the preset temperature"). In one example, the formation device 12 verifies whether the cell temperature probe PB1 is abnormal or not by comparing the sensing temperature value with the standard temperature value. When the difference between the sensing temperature value and the standard temperature value is greater than a predetermined value (e.g. 1° C.), it is determined that the cell temperature probe PB1 is abnormal. Thereby, the maintenance staff could repair or replace the cell temperature probe PB1. In another example, when the microcomputer 171 sends back the standard temperature value to the internal computer of the formation device 12, the internal computer of the formation device 12 is capable of performing a calibration for the cell temperature probe PB1 according to the standard temperature values and the sensing temperature values so as to obtain more accurate cell temperature information. The detailed descriptions regarding the verification and the calibration which are performed for the cell temperature probe will be illustrated in the following paragraphs.

In one embodiment, as shown in FIG. 4, the probe-contacting area CA1 serves as a measurement slot DG1 with concave pattern formed on the outer surface S1, and the measurement slot DG1 is used to make the sensing temperature value, generated by the cell temperature probe, represent the actual temperature of the object more accurately. More specifically, it is possible that a flow of air occurs during the process of the operation within the formation device. The flow of air, for example, may be generated by an operation of an exhaust fan for reducing toxic gas. The flow of air may result in errors of sensing temperature by the cell temperature probe on the probe-contacting area CA1. As a result, a significant difference exists between the sensing temperature value and the preset temperature. In order to avoid this problem, in the embodiment of FIG. 4, the probe-contacting area CA1 is designed as the measurement slot DG1 with concave pattern formed on the outer surface S1. Even though the flow of air occurs during the process of sensing temperature, with the concave structure, the cell temperature probe PB1 is capable of avoiding the flow of air, so that the sensing temperature value represents the actual temperature of the object more accurately. Thereby, the misjudgment for the cell temperature probe PB1 can be avoided.

Figure 5:
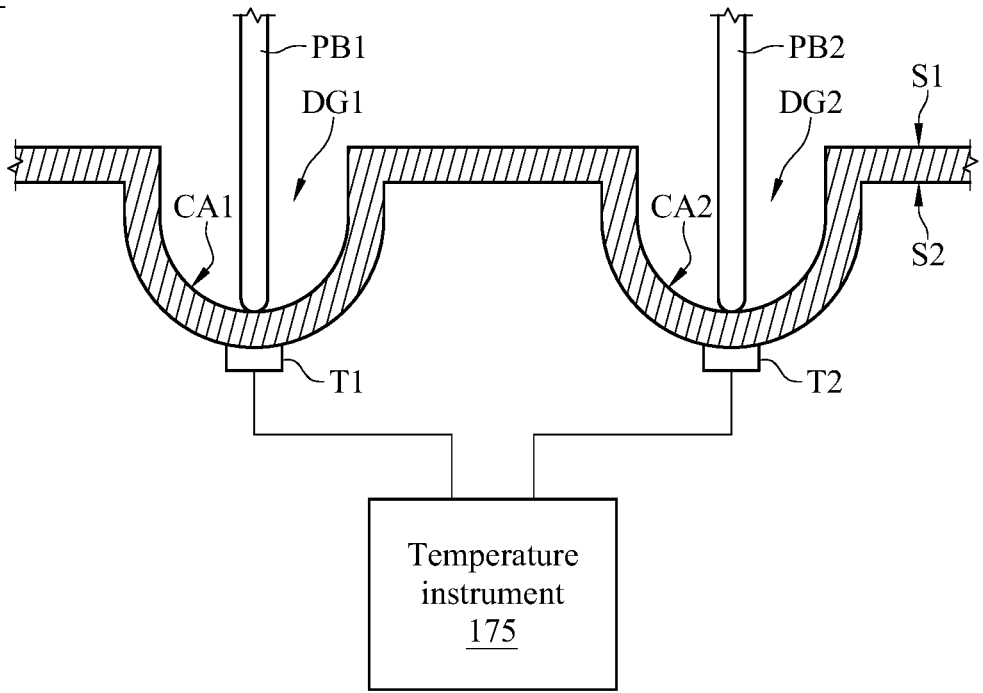
FIG. 5 is a part of sectional view of a measurement case operated with a cell temperature probe of a formation device according to another embodiment of the present disclosure.

Please refer to FIG. 5, which is a part of sectional view of the measurement case 173 operated with a cell temperature probe PB1 of the formation device 12 according to another embodiment of the present disclosure. In this embodiment, in addition to the probe-contacting area CA1 described as above, as shown in FIG. 5, the outer surface S1 further includes another probe-contacting area CA2 adapted to be contacted by another cell temperature probe PB2 in the formation device 12. The temperature instrument 175 further includes another sensing terminal T2 disposed on the inner surface S2 of the measurement case 173. The location of the sensing terminal T2 disposed on the inner surface S2 is aligned with the probe-contacting area CA2 in the direction of the thickness of the measurement case 173. In this embodiment, there are two probe-contacting areas CA1 and CA2 disposed with two sensing terminals T1 and T2 respectively. One of the purposes is to confirm whether one of sensing terminals T1 and T2 of the temperature instrument 175 is abnormal. More specifically, in the testing process, when the set of heaters 177 heats the measurement case 173 so that the measurement case 173 has the preset temperature (e.g. 60° C.), the overall body of the measurement case 173 approximately has the preset temperature. In a normal situation, a difference between the two standard temperature values respectively captured by the two sensing terminals T1 and T2 of the temperature instrument 175 disposed on the inner surface S2 of the measurement case 173 should be insignificant. For example, both of the two standard temperature values are approximately 60° C.

In other words, if the difference between the two standard temperature values respectively captured by the two sensing terminals T1 and T2 is significant, it means that at least one of the two sensing terminals T1 and T2 is abnormal. For example, the difference between the two values of the sensing terminal T1 and the sensing terminal T2 reaches 10° C. In this case, the maintenance staff has to repair the sensing terminal of the temperature instrument, so as to prevent from capturing incorrect standard temperature values and affecting an accuracy of the testing process. In an implementation of the embodiment of FIG. 1, after the testing fixture 17 complete the testing process in the formation device 12 and obtains testing information, the central control system 10 outputs another control command to another formation device (e.g. the formation device 13) as well as the testing fixture 17, so as to start performing another testing process. Since another testing process is similar to the testing process described in the above embodiment, another testing process is not more repeated here.

Figure 6:
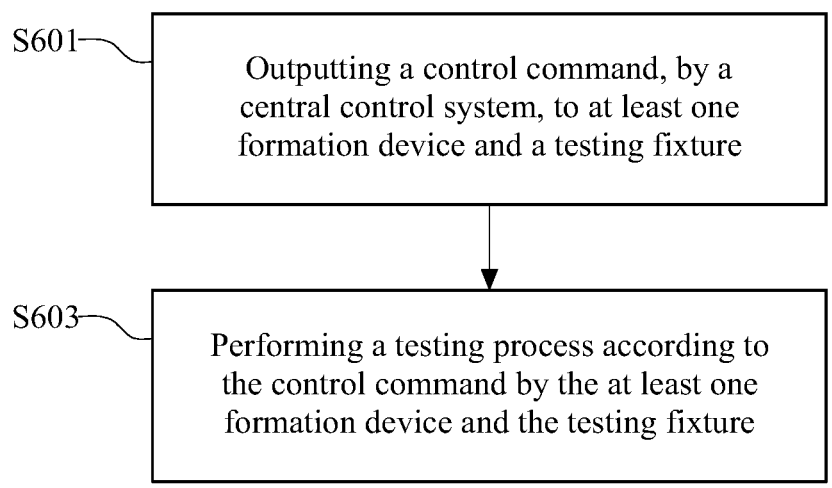
FIG. 6 is a flow chart of a method for testing a cell temperature probe according to one embodiment of the present disclosure.
Figure 7:
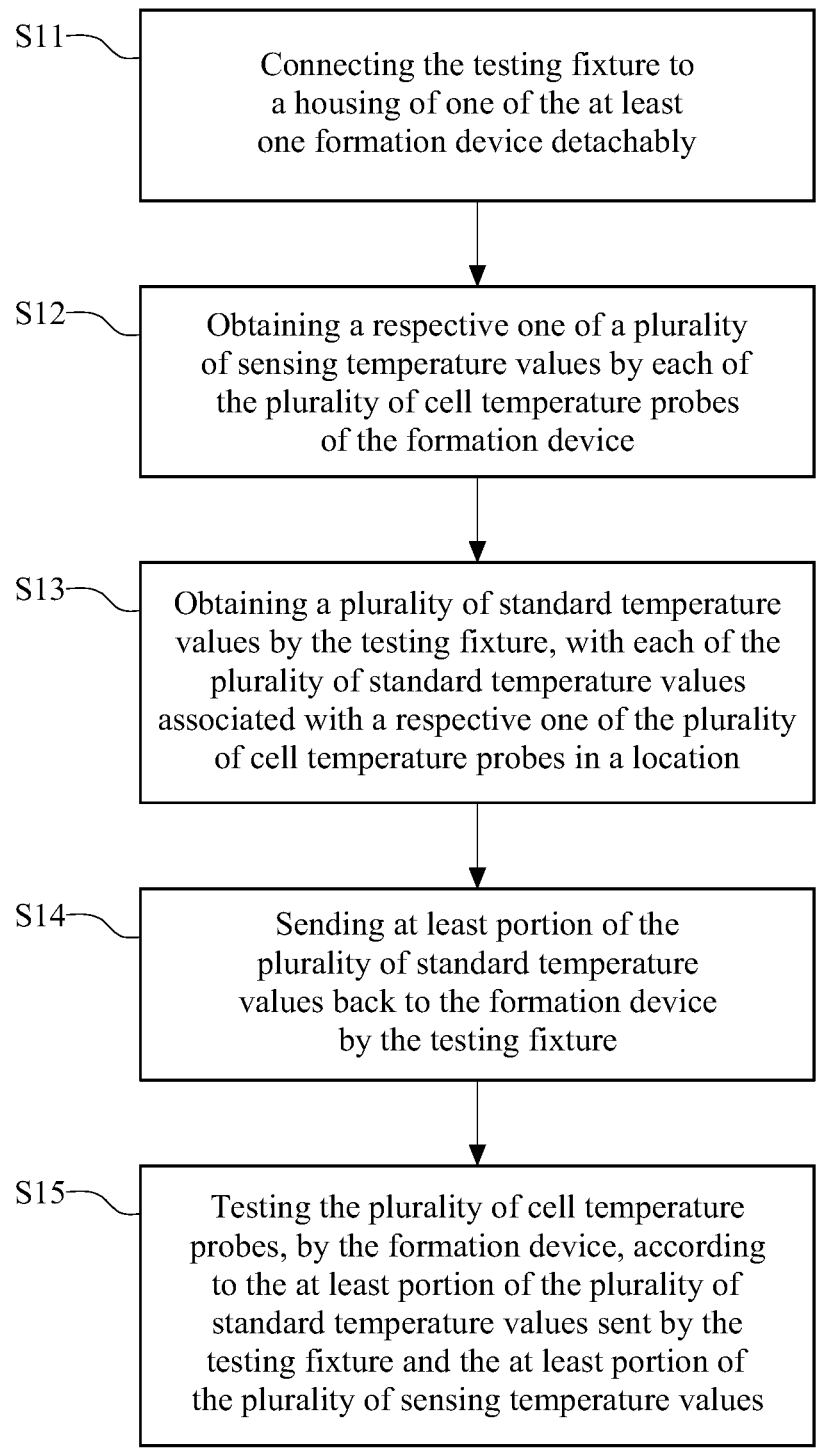
FIG. 7 is a flow chart of steps illustrating the testing process according to one embodiment of the present disclosure.

Please refer to FIG. 6, which is a flow chart of a method for testing a cell temperature probe according to one embodiment of the present disclosure. The method is adapted to the testing system and the testing fixture mentioned in FIG. 1 to FIG. 5. As shown in FIG. 6, in step S601, the central control system 10 arranges a testing schedule and outputs a control command via a local area network to notify one of a plurality of formation devices (e.g. the formation device 12 shown in FIG. 1) as well as the testing fixture 17. In further, in step S603, the formation device 12 and the testing fixture 17 both perform a testing process according to the control command. Please refer to FIG. 7, which is a flow chart of steps illustrating the testing process according to one embodiment of the present disclosure. As shown in FIG. 7, the testing process includes steps S11-S15. In step S11, a transporting machine 20 delivers the testing fixture 17 to the formation device 12 to be tested and further drives the testing fixture 17 to be clamped and connected to the compartment 122 of the formation device 12. Then, the central control system 10 sends testing parameters to the internal computer of the formation device 12. In step S12, a plurality of cell temperature probes (e.g. the cell temperature probes PB1 and PB2 shown in FIG. 4) of the formation device 12 is respectively disposed on and contacted by the probe-contacting areas (e.g. the probe-contacting areas CA1 and CA2) of the measurement case 173 so as to capture the sensing temperature values respectively. In step S13, the temperature instrument 175 of the testing fixture 17 captures a plurality of standard temperature values, with each of them associated with one of the cell temperature probes in a respective location. In step S14, the microcomputer 171 of the testing fixture 17 sends back at least portion of the standard temperature values to the formation device 12. In step S15, the internal computer of the formation device 12 further tests the cell temperature probes according to the at least portion of standard temperature values.

In one embodiment, the testing process serves as a verification process. In practice, the internal computer of the formation device 12 is capable of determining that testing process serves as the verification process based on testing parameters when the internal computer of the formation device 12 receives the testing parameters from the central control system 10. In the verification process, the testing fixture 17 sends back the captured standard temperature values to the formation device 12. The formation device 12 determines whether the cell temperature probes are abnormal or not according to those standard temperature values as well as those sensing temperature values, and further generates a verification report to be displayed in the central control system for a technical staff. For example, in addition to the cell temperature probes PB1 and PB2 described as above, the formation device 12 further includes other cell temperature probes PB3-PB8 (not shown in figures) adapted to sense their respective sensing temperature values. Moreover, in addition to the sensing terminals T1 and T2 described as above, the temperature instrument 175 further includes other sensing terminals T3-T8 (not shown in figures) disposed on the inner surface S2 of the measurement case 173, which are adapted to capture their respective standard temperature values. In this case, the formation device 12 is capable of determining whether the cell temperature probes PB3-PB8 are abnormal or not according to differences between the sensing temperature values and the standard temperature values, and further reports the result of determination to the central control system 10, so that a verification report is generated as shown in Table I below.

Specifically, when the result of determination generated by the formation device 12 indicates a temperature difference within their tolerances, it is determined that the respective cell temperature probe is normal (namely "Pass"). As shown in the verification report (Table I), since the differences between each of the standard temperature values respectively captured by the sensing terminals T1-T8 in locations and a respective one of the sensing temperature values sensed respectively from the locations are all within an acceptable tolerance (e.g. 2° C.), the result of determination indicates that all cell temperature probes are normal, which represents "Pass". However, in another example, when a standard temperature value captured by one of the sensing terminals T1-T8 and the sensing temperature corresponding to the location in which the standard temperature value is captured goes beyond the tolerance, the formation device 12 determines that the sensing terminal is abnormal and the verification report shows "Fail" on the corresponding column of the table. As a result, a maintenance staff repairs or replaces the abnormal cell temperature probe, so that it is ensured that a real cell temperature can be detected and the situation of the overheated cell can be avoided.

TABLE I

| sensing terminal | PB1 | PB2 | PB3 | PB4 | PB5 | PB6 | PB7 | PB8 |
|---|---|---|---|---|---|---|---|---|
| Standard temperature (° C.) | 25 | 24 | 25 | 26 | 24 | 26 | 25 | 26 |
| Cell temperature probe | T1 | T2 | T3 | T4 | T5 | T6 | T7 | T8 |
| Sensing temperature (° C.) | 26 | 25 | 24 | 25 | 25 | 24 | 24 | 24 |
| Determination result | Pass | Pass | Pass | Pass | Pass | Pass | Pass | Pass |

In another embodiment, the testing process serves as a calibration process. In practice, when receiving testing parameters from the central control system 10 by the internal computer of the formation device 12, the internal computer of the formation device 12 determines that the testing process serves as the calibration process according to the testing parameters. In the calibration process, the testing fixture 17 sends back the standard temperature values to the formation device 12, so that the formation device 12 perform an algorithm based on the standard temperature values and the sensing temperature values so as to calibrate a portion of the cell temperature probes. In other words, comparing to the verification process as described above, in the calibration process, the formation device 12 calibrates the cell temperature probes instead of determining whether the cell temperature probe is abnormal or not (Pass/Fail) according to the differences between the standard temperature values and the sensing temperature values. In one embodiment, the calibration refers to a process that the internal computer of the formation device 12 computes an offset of the cell temperature probe with respect to a temperature range based on an algorithm, and further calibrates the cell temperature probe with a value of the offset. Accordingly, it is expected that the cell temperature probe obtains more accurate sensing temperature when testing the cells.

For example, the testing fixture 17 detects that one cell temperature probe in the formation device 12 has an offset with a decrement of 5° C., in the range of 50 to 60° C. When the cell temperature probe performing a testing in the range of 50 to 60° C., the internal computer of the formation device 12 develops an algorithm according to the offset for automatically calibrating the cell temperature probe with an increment of 5° C., so that more accurate temperature information can be obtained.

Based on the above descriptions, in the testing fixture, the testing system and the method for testing the cell temperature probe disclosed in the present disclosure, the measurement case of the testing fixture can be operated with the temperature instrument so as to capture the standard temperature values, and the standard temperature values can be further compared to the sensing temperature values sensed by the cell temperature probes on the measurement case to test the cell temperature probe. Thereby, the cell temperature probe can be verified and accordingly the maintenance staff is able to notice whether to repair or replace the cell temperature probe. Furthermore, the cell temperature probe can be automatically calibrated, so that the temperature information obtained by the cell temperature probe is more accurate.

What is claimed is:

1. A testing fixture for a cell temperature probe, adapted to a formation device and a central control system, with the formation device configured to perform a testing process according to a control command from the central control system, the testing fixture comprising:
    a microcomputer communicatively connected to the central control system and configured to receive the control command for performing the testing process;
    a measurement case having an outer surface and an inner surface opposite to the outer surface, with the outer surface comprising a probe-contacting area adapted to be contacted by the cell temperature probe within the formation device during the testing process, so that a sensing temperature value related to the measurement case is obtained by the cell temperature probe;
    a temperature instrument electrically connected to the microcomputer, with the temperature instrument having a sensing terminal disposed on the inner surface of the measurement case, and a location of the sensing terminal disposed in the inner surface is aligned with the probe-contacting area in a direction of a thickness of the measurement case; and a set of heaters electrically connected to the microcomputer and thermally connected to the measurement case, wherein the set of heaters includes two heat sources, and the two heat sources are respectively disposed on two opposite sides of the measurement case and configured to heat the measurement case for simulating a cell temperature variation during a charging and a discharging process.

2. The testing fixture according to claim 1, wherein the probe-contacting area with a concave pattern serves as a measurement slot formed on the outer surface.

3. The testing fixture according to claim 1, wherein the outer surface further comprises another probe-contacting area adapted to be contacted by another cell temperature probe within the formation device, the temperature instrument further has another sensing terminal disposed on the inner surface of the measurement case, and a location of the another sensing terminal disposed in the inner surface is aligned with the another probe-contacting area in the direction of the thickness of the measurement case.

4. A testing system for a cell temperature probe, comprising:
a central control system configured to generate a control command;
at least one formation device communicatively connected to the central control system, with each of the at least one formation device comprising a cell temperature probe and configured to perform a testing process according to the control command; and
a testing fixture communicatively connected to the central control system and configured to receive the control command and selectively perform the testing process for one of the at least one formation device, with the testing fixture capable of detachably connecting to a compartment of the formation device, and the cell temperature probe adapted to contact a probe-contacting area within the testing fixture;
wherein the testing fixture comprises a measurement case and a set of heaters thermally connected to the measurement case, the set of heaters includes two heat sources, and the two heat sources are respectively disposed on two opposite sides of the measurement case and configured to heat the measurement case for simulating a cell temperature variation during a charging and a discharging process.

5. The testing system according to claim 4, wherein the measurement case having an outer surface and an inner surface opposite to the outer surface, the outer surface comprises the probe-contacting area adapted to be contacted by the cell temperature probe within the formation device, the testing fixture further comprises:
a microcomputer electrically connected to the set of heaters and configured to receive the control command for performing the testing process; and
a temperature instrument electrically connected to the microcomputer, with the temperature instrument having a sensing terminal disposed on the inner surface of the measurement case, and a location of the sensing terminal disposed in the inner surface is aligned with the probe-contacting area in a direction of a thickness of the measurement case.

6. The testing system according to claim 5, wherein the probe-contacting area with a concave pattern serves as a measurement slot formed on the outer surface.

7. The testing system according to claim 5, wherein the outer surface further comprises another probe-contacting area adapted to be contacted by another cell temperature probe within the formation device, the temperature instrument further has another sensing terminal disposed on the inner surface of the measurement case, and a location of the another sensing terminal disposed in the inner surface is aligned with the another probe-contacting area in the direction of the thickness of the measurement case.

8. A method for testing cell temperature probes, comprising:
outputting a control command, by a central control system, to at least one formation device and a testing fixture, wherein each of the at least one formation device comprising a plurality of cell temperature probes; and
performing a testing process according to the control command by the at least one formation device and the testing fixture;
wherein the testing process comprises:
connecting the testing fixture to a compartment of one of the at least one formation device detachably;
heating up a measurement case of the testing fixture by a set of heaters thermally connected to the measurement case of the testing fixture for simulating a cell temperature variation during a charging and a discharging process, wherein the set of heaters includes two heat sources, and the two heat sources are respectively disposed on two opposite sides of the measurement case;
obtaining a respective one of a plurality of sensing temperature values by each of the plurality of cell temperature probes of the formation device;
obtaining a plurality of standard temperature values by the testing fixture, with each of the plurality of standard temperature values associated with a respective one of the plurality of cell temperature probes in a location;
sending at least portion of the plurality of standard temperature values back to the formation device by the testing fixture; and
testing the plurality of cell temperature probes, by the formation device, according to the at least portion of the plurality of standard temperature values sent by the testing fixture and the at least portion of the plurality of sensing temperature values.

9. The method according to claim 8, wherein the testing process serves as a verification process, in the verification process, the testing fixture sends back the at least portion of the plurality of standard temperature values to the formation device, so that the formation device verifies whether the plurality of cell temperature probes is abnormal according to differences between the at least portion of the plurality of standard temperature values and the at least portion of the plurality of sensing temperature values.

10. The method according to claim 8, wherein the testing process serves as a calibration process, in the calibration process, the testing fixture sends back the at least portion of the plurality of standard temperature values to the formation device, so that the formation device performs an algorithm based on the at least portion of the plurality of standard temperature values and the at least portion of the plurality of sensing temperature values so as to calibrate the plurality of cell temperature probes.

* * * * *